United States Patent [19]

Smith

[11] Patent Number: 5,041,740

[45] Date of Patent: Aug. 20, 1991

[54] PARALLEL CLOCKED LATCH

[75] Inventor: Robert T. Smith, Mesa, Ariz.

[73] Assignee: Motorola, Inc., Schaumburg, Ill.

[21] Appl. No.: 516,636

[22] Filed: Apr. 30, 1990

[51] Int. Cl.$^5$ ............................................. H03K 3/26
[52] U.S. Cl. ................................. 307/279; 307/272.1
[58] Field of Search ................... 307/279, 272.1, 272.2, 307/481, 455

[56] References Cited

U.S. PATENT DOCUMENTS

| | | | |
|---|---|---|---|
| 4,656,368 | 4/1987 | McCombs et al. | 307/481 |
| 4,883,985 | 11/1989 | Katsu et al. | 307/279 |
| 4,970,406 | 11/1990 | Fitzpatrick | 307/279 |
| 4,975,596 | 12/1990 | Thomas et al. | 307/279 |
| 4,982,111 | 1/1991 | Nakaizumi | 307/279 |

Primary Examiner—David Hudspeth
Assistant Examiner—Andrew Sanders
Attorney, Agent, or Firm—Bradley J. Botsch

[57] ABSTRACT

A parallel clocked latch circuit having a plurality of inputs and first and second outputs includes a gate circuit responsive to the plurality of inputs for providing first and second logic output signals which are coupled to the first and second outputs of the parallel clocked latch circuit, respectively. A regeneration circuit responsive to the first and second logic output signals for storing logic levels at the first and second outputs of the latch circuit. A level shifting circuit coupled to the gate circuit for providing a predetermined voltage level shift of the logic levels of the gate circuit. A field-effect transistor having a drain coupled to the regeneration circuit, a gate coupled to a control signal, and a source coupled to a lowest level of the gate circuit, the control signal having a first logic state voltage level greater than the voltage level of a first logic state of the gate circuit by a predetermined voltage such that when the control signal is in a first logic state the regeneration circuit is rendered operative and the gate circuit is rendered non-operative. Also, a current source coupled between the source of the field-effect transistor and a first supply voltage terminal.

9 Claims, 1 Drawing Sheet

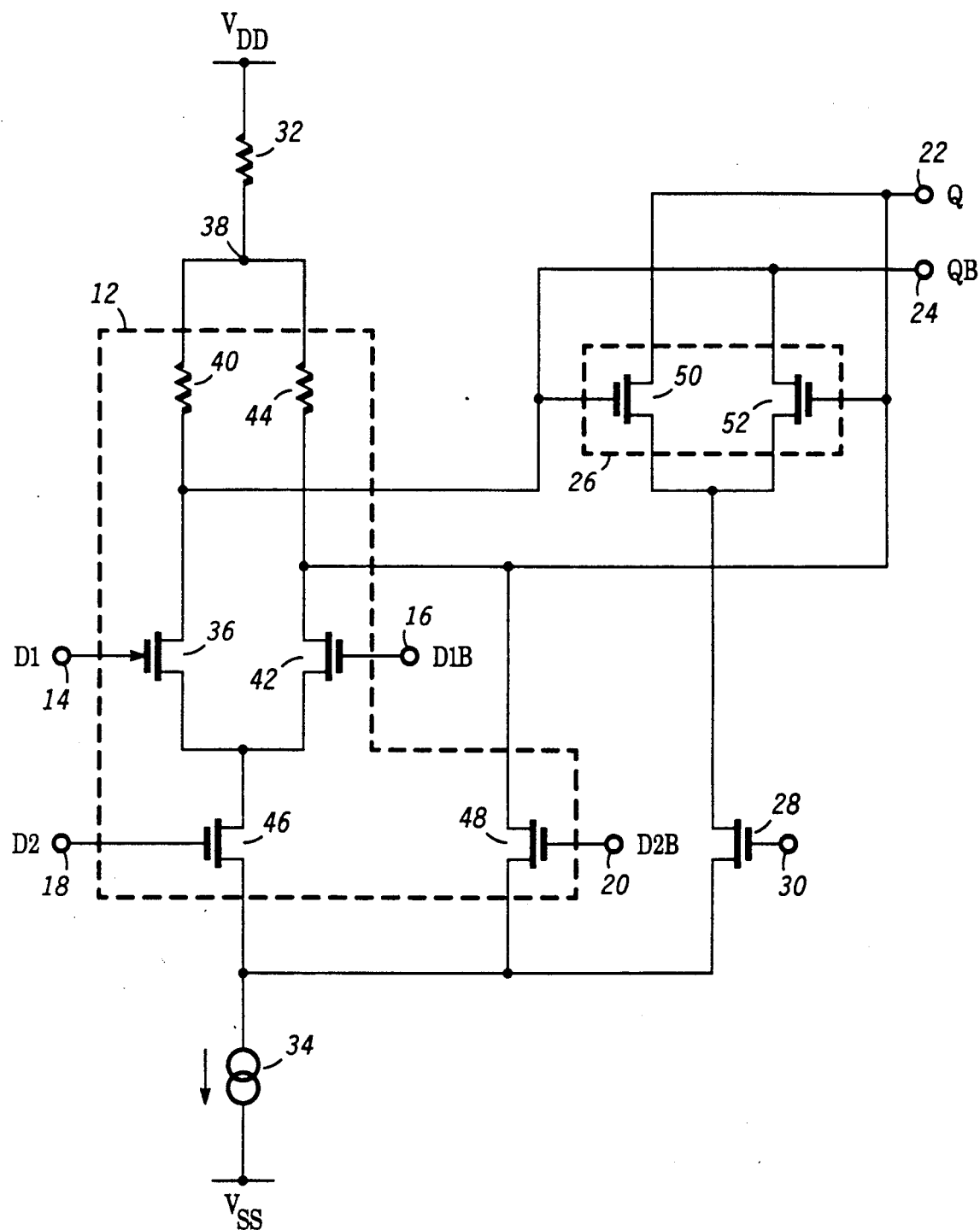

PARALLEL CLOCKED LATCH

BACKGROUND OF THE INVENTION

The present invention relates to common mode logic (CML) circuits and, in particular, to parallel clocked CML latch circuits.

Latch circuits have numerous applications and are well known in the art. A latch circuit typically consists of an acquire stage and a regeneration stage where data is clocked into the acquire stage when a clock is in a first logic state and then stored in the regeneration stage when the clock is in a second logic state as is known. Furthermore, the acquire stage can also provide an AND gate function that is typically comprised of a predetermined number of gating levels such that the number of gating levels corresponds to the number of differential inputs to the AND gate. Therefore, a two-input AND gate has differentially coupled transistors configured such that the source electrodes of the first and second transistors of the first gating level are coupled to the drain electrode of a first transistor of a second gating level while the drain electrode of the second transistor of the second gating level is coupled to the drain electrode of the second transistor of the first gating level. Also, the drain electrodes of the first and second transistors of the first gating level are coupled to a supply voltage terminal through separate resistors and the source electrodes of the first and second transistors of the second gating level are coupled to an independent or constant current source. In addition, the gate electrodes of the first and second transistors of the first gating level are typically coupled to a first differential input signal while the gate electrodes of the first and second transistors of the second gating level are typically coupled to a second differential input signal. Further, this configuration can be expanded to a plurality of different gating levels configured in a similar aforedescribed manner thereby providing an AND gate having a plurality of differential inputs as is known. Hence, as an example, a three-input AND gate would require three levels of gating such that if all non-inverting inputs to the AND gate are a logic high, then a non-inverting output of the latch circuit will also be a logic high as is understood.

Most, if not all, prior art has performed the clock function of the latch circuit by adding an extra gating level that is coupled to the lowest gating level of the AND gate in a similar aforedescribed manner as the different levels are configured in the AND gate. Therefore, the clock gating level typically includes a pair of differentially coupled transistors such that the drain electrode of the first transistor of the clock gating level is coupled to the source electrodes of the first and second transistors of the lowest gating level of the AND gate while the drain electrode of the second transistor of the clock gating level is coupled to the regeneration stage of the latch circuit. Further, the source electrodes of the first and second transistors of the clock gating level are now coupled to the independent or constant current source while the gate electrodes of the same are coupled to a differential clock signal. Thus, when the differential clock is in a first logic state, the first transistor of the clock gating level is turned on thereby rendering the acquire stage (AND gate) operative. Furthermore, when the differential clock is in a second logic state, the second transistor of the clock gating level is turned on thereby rendering the regeneration stage operative as is understood. However, since each gating level requires a substantial amount of current, the number of gating levels in the latch circuit is directly proportional to the power dissipated. Therefore, if the clock function of the latch circuit could be provided in parallel with the AND gate and, thus, abating the addition of an extra clock gating level, a substantial power reduction would result along with a decrease in device count.

Hence, a need exists for a parallel clocked latch circuit having minimum power and minimum device count.

SUMMARY OF THE INVENTION

Accordingly, it is an object of the present invention to provide an improved latch circuit.

Another object of the present invention is to provide an improved parallel clocked latch circuit.

Yet another object of the present invention is to provide an improved clocked latch circuit having minimum power and device count.

In carrying out the above and other objects of the present invention, there is provided a parallel clocked latch circuit having a plurality of inputs and first and second outputs comprising an input gate circuit responsive to logic input signals supplied to the plurality of inputs for providing corresponding complementary output logic signals at the first and second outputs when the input gate circuit is rendered operative; a regeneration circuit coupled to both the input gate circuit and the first and second outputs for maintaining the complementary output logic signals at the first and second outputs when rendered operative while the input gate circuit is rendered non-operative; a control circuit responsive to a clock signal for alternately rendering the input gate circuit and the regenerating circuit operative and non-operative; and a level shifting circuit for level shifting the complementary output logic signals.

The above and other objects, features and advantages of the present invention will be better understood from the following detailed description taken in conjunction with the accompanying drawing.

BRIEF DESCRIPTION OF THE DRAWING

The sole FIGURE is a detailed schematic diagram illustrating the latch circuit of the preferred embodiment of the present invention.

DETAILED DESCRIPTION OF THE PREFERRED EMBODIMENT

Referring to the sole figure, a detailed schematic of latch circuit 10 of the present invention is shown comprising AND gate 12 having a first input coupled to input terminal 14 at which signal D1 is supplied, a second input coupled to input terminal 16 at which signal D1B is supplied, a third input coupled to input terminal 18 at which signal D2 is supplied, and a fourth input coupled to input terminal 20 at which signal D2B is supplied where signals D1 and D1B and D2 and D2B are differential pair signals, respectively. AND gate 12 also includes first and second outputs coupled to output terminals 22 and 24, respectively, for providing signals Q and QB, respectively, where signals Q and QB are the differential output signals of latch circuit 10. The first and second outputs of AND gate 12 are also coupled to regeneration circuit 26, the latter also being coupled to first and second output terminals 22 and 24. Field effect transistor 28 has a drain coupled to regeneration circuit 26, a gate coupled to input terminal 30 at which control or clock signal CLK is supplied, and a source coupled to AND gate 12. Latch circuit 10 also includes resistor 32 coupled between a first supply voltage terminal, at which the operating potential $V_{DD}$ is applied, and node 38. AND gate 12 is coupled to independent current source 34, the latter being coupled to a second supply voltage terminal at which the operating potential $V_{SS}$ is applied.

AND gate 12 includes field-effect transistor 36 having a drain coupled to node 38 by resistor 40 and to the second output of AND gate 12. Field-effect transistor 36 further has a gate coupled to first input 14 of AND gate 12, and a source coupled to the source of field-effect transistor 42. The drain of field-effect transistor 42 is coupled to node 38 by resistor 44 and to the first output of AND gate 12. Also, the gate of field-effect transistor 42 is coupled to second input 16 of AND gate 12. AND gate 12 further includes field-effect transistor 46 having a drain coupled to the sources of field-effect transistors 36 and 42, a gate coupled to third input 18 of AND gate 12, and a source coupled to the source of field-effect transistor 48. Field-effect transistor 48 further has a drain coupled to the drain of field-effect transistor 42 and a gate coupled to fourth input 20 of AND gate 12.

Regeneration circuit 26 includes field-effect transistor 50 having a drain coupled to output terminal 22, a gate coupled to both output terminal 24 and to the second output of AND gate 12, and a source coupled to the source of field-effect transistor 52 and to the drain of field-effect transistor 28. The drain of field-effect transistor 52 is coupled to output terminal 24 while its gate is coupled to both output terminal 22 and the first output of AND gate 12.

In operation, differential signals D1 and D1B are typically applied to input terminals 14 and 16 whereby the non-inverting signal is applied to input terminal 14 and the inverting signal is applied to input terminal 16. Likewise, differential signals D2 and D2B are typically applied to input terminals 18 and 20 whereby the non-inverting signal is applied to input terminal 18 and the inverting signal is applied to input terminal 20. Also, a logic clock signal (CLK) is typically applied to input terminal 30. When the clock signal CLK is in a first logic state, for example a logic low, substantially all the current provided by independent current source 34 flows through AND gate 12 and substantially zero current flows through regeneration circuit 26. Therefore, AND gate 12 is rendered operative and regeneration circuit 26 is rendered non-operative. Furthermore, AND gate 12 is comprised of two levels of gating: the first (upper) level includes differentially coupled transistors 36 and 42; and the second (lower) level includes differentially coupled transistors 46 and 48. It should be obvious to one of ordinary skill in the art from the above description that a third level of gating could be added which would include another pair of differentially coupled transistors (not shown) such that the drain of one of the transistors would be coupled to the sources of transistors 46 and 48, while the drain of the other transistor would be coupled to the drain of transistor 42. Also, the gates of the third level transistors would be coupled to another differential input signal. This configuration would comprise a differential three-input AND gate as is understood. Furthermore, it should be understood that a plurality of gating levels could be added in an aforedescribed manner to provide an AND gate having a plurality of inputs. However, latch circuit 10 shows a differential two-input AND gate having two gating levels for simplicity. Therefore, when rendered operative, AND gate 12 provides a logic high to output terminal 22 and a corresponding logic low to output terminal 24 when a logic high is applied to both input terminals 14 and 18 and a corresponding logic low is applied to input terminals 16 and 20. It is important to realize that resistor 32 is a level shifting circuit such that the logic high and logic low voltage levels for AND gate 12 are:

$$V_{high} = V_{DD} - (R_{32} * I_{34})$$

$$V_{low} = V_{DD} - (R_{32} * I_{34}) - (R_{40/44} * I_{34})$$

where $R_{32}$ is the resistance of resistor 32;
$I_{34}$ is the current provided by independent current source 34; and
$R_{40/44}$ is the resistance of resistor 40 or 44.

Therefore, the logic levels of AND gate 12 have been level shifted by a predetermined voltage occurring across resistor 32.

It is worth noting that AND gate 12 could be replaced by a MUX or an XOR circuit or by any gating circuit that is capable of providing output logic levels.

On the other hand, when the clock signal CLK applied to input terminal 30 is a logic high, substantially all the current provided by independent current source 34 flows through regeneration circuit 26 and substantially zero current flows through AND gate 12. Therefore, regeneration circuit 26 is rendered operative and AND gate 12 is rendered non-operative. Regeneration circuit 26 now stores and holds the present logic levels occurring at output terminals 22 and 24 via the two inverters comprised of field-effect transistors 50 and 52. Therefore, as an example, if a logic high is present at output terminal 22, field-effect transistor 52 will invert the logic high signal at its gate and provide a logic low at its drain and, also to output terminal 24. In addition, since a logic high was present at output terminal 22, a logic low will be present at output terminal 24 and FET 50 will invert this logic low signal at its gate and provide a logic high at its drain and, also to output terminal 22. It is also understood that a similar result will occur if a logic low was originally assumed to be present at output terminal 22 instead of the logic high in the above example. It is important to realize that the logic high voltage level for clock signal 30 must exceed the logic high voltage level for AND gate 12 by a predetermined voltage such that when clock signal 30 is a logic high, all the current of independent current source 34 flows through regeneration circuit 26 thereby turning on regeneration circuit 26 and turning off AND gate 12. Therefore, as an example, appropriate logic levels for clock signal 30 are the following:

$$V_{high} = V_{DD}$$

$$V_{low} = V_{DD} - 2*(R_{32}*I_{34})$$

Note that if $R_{32}$ equals $R_{40}$ and $R_{44}$, the logic low voltage level ($V_{low}$) for the clock signal is equivalent to logic low for AND gate 12. However, the logic high voltage level ($V_{high}$) for the clock signal is not level shifted by the voltage drop across resistor 32 as was the case for the logic high level of AND gate 12, therefore, the importance of resistor 32 should become clear. That is, in order for field-effect transistor 28 to be coupled in parallel with the lowest gating level of AND gate 12 and provide the clock function for latch circuit 10, the gate of field-effect transistor 28 must be brought to a logic high voltage level that exceeds the logic high voltage level of AND gate 12 by a predetermined voltage. This, of course, is accomplished by resistor 32 which levels shifts the logic levels of AND gate 12 by a predetermined voltage that occurs across resistor 32 as was aforementioned. Furthermore, the logic high voltage applied at terminal (30) is to exceed the logic high voltage applied at the inputs of and gate (12) by a predetermined voltage.

Another aspect of the present invention is the ability to provide (N+1) levels of gating having a similar power dissipation as N levels of prior art gating. In other words, since the clock function is provided in parallel with the lowest gating level of the AND gate, an extra gating level can be added with no additional power consumption when compared with the prior art.

It is also worth noting that latch circuit 10 could be comprised of bipolar transistors, however, the logic levels applied to the bipolar transistors of the different gating levels for gate 12 must be chosen so as to prevent saturation. Therefore, for a bipolar counterpart of latch circuit 10, differential signals D1 and D1B would typically be driven by an emitter follower while differential signals D2 and D2B would typically be driven by two emitter followers.

By now it should be appreciated that there has been provided a novel parallel clocked latch circuit having minimum power and device count.

What is claimed is:

1. A parallel clocked latch circuit having a plurality of inputs and first and second outputs, comprising:
    an input gate circuit responsive to logic input signals supplied to the plurality of inputs for providing corresponding complementary output logic signals at the first and second outputs when said input gate circuit is rendered operative;
    regeneration circuit means coupled to both said input gate circuit and the first and second outputs for maintaining said complementary output logic signals at the first and second outputs when redered operative while said input gate circuit is rendered non-operative;
    control circuit means responsive to a clock signal for alternately rendering said input gate circuit and said regenerating circuit means operative and non-operative, said clock signal having a first logic state level that exceeds a first logic state level of said logic input signals of said input gate circuit by a predetermined magnitude such that said clock signal being in a first logic state renders said regeneration circuit means operative and said input gate circuit non-operative; and
    level shifting means coupled to said input gate circuit for level shifting said complementary output logic signals.

2. The parallel clocked latch circuit according to claim 1 wherein said control circuit means includes:
    a transistor having first, second and control electrodes, said control electrode being coupled to receive said clock signal, said first electrode being coupled to said regeneration circuit means, and said second electrode being coupled to said input gate circuit.

3. The parallel clocked latch circuit according to claim 2 wherein said level shifting means includes:
    a resistor coupled between a first supply voltage terminal and said input gate circuit.

4. The parallel clocked latch circuit according to claim 3 wherein said input gate circuit includes:
    a first transistor having first, second and control electrodes, said first electrode being coupled to said level shifting means and to the second output, and said control electrode being coupled to a first one of the plurality of inputs;
    a second transistor having first, second and control electrodes, said first electrode being coupled to said level shifting means and to the first output, said second electrode being coupled to said second electrode of said first transistor of said input gate circuit, and said control electrode being coupled to a second one of the plurality of inputs;
    a third transistor having first, second and contrl electrodes, said first electrode being coupled to said second electrodes of said first and second transistors of said input gate circuit, and said control electrode being coupled to a third one of the plurality of inputs;
    a fourth transistor having first, second and control electrode, said first electrode being coupled to said first electrode of said second transistor of said input gate circuit, said second electrode being coupled to said second electrode of said third transistor and to said second electrode of said transistor of said control circuit means, and said control electrode being coupled to a fourth one of the plurality of inputs;
    a first resistor coupled between said first electrode of said first transistor and said level shifting means; and
    a second resistor coupled between said first electrode of said second transistor and said level shifting means.

5. The parallel clocked latch circuit according to claim 4 wherein said regeneration circuit means includes:
    a first transistor having first, second and control electrodes, said first electrode being coupled to the first output, and said control electrode being coupled to the second output; and
    a second transistor having first, second and control electrodes, said first electrode being coupled to the second output, said second electrode being coupled to said second electrode of said first transistor of said regeneration circuit means and to said first electrode of said transistor of said control circuit means, and said control electrode being coupled to the first output.

6. A parallel clocked latch circuit having first and second outputs, comprising:
    a first field-effect transistor having first, second and control electrodes, said first electrode being coupled to the second and control electrodes, said first electrode being coupled to the second output and to a first supply voltage terminal, and said control electrode being coupled to a first input;
    a second field-effect transistor having first, second and control electrodes, said first electrode being coupled to the first output and to said first supply voltage terminal, said second electrode being coupled to said second electrode of said first field-effect transistor, and said control electrode being coupled to a second input,;

a third field-effect transistor having first, second and control electrodes, said first electrode being coupled to said second electrodes of said first and second field-effect transistors, and said control electrode being coupled to a third input;

a fourth field-effect transistor having first, second and control electrodes, said first electrode being coupled to said first electrode of said second field-effect transistor, said second electrode being coupled to said second electrode of said third field-effect transistor, and said control electrode being coupled to a fourth input;

a fifth field-effect transistor having first, second and control electrodes, said control electrode being coupled to a fifth input, and said second electrode being coupled to said second electrodes of said third and fourth field-effect transistors;

a sixth field-effect transistor having first, second and control electrodes, said first electrode being coupled to the first output, and said control electrode being coupled to the second output;

a seventh field-effect transistor having first, second and control electrodes, said first electrode being coupled to the second output, said second electrode being coupled to said second electrode of said sixth field-effect transistor and to said first electrode of said fifth field-effect transistor, and said control electrode being coupled to the first output;

a current source coupled between said second electrodes of said third, fourth and fifth field-effect transistors and a second supply voltage terminal;

a series combination of first and second resistors coupled between said first electrode of said first field-effect transistor and said first supply voltage terminal wherein said second resistor has a first terminal coupled to said first supply voltage terminal; and a series combination of a third and said second resistors coupled between said first electrode of said second field-effect transistor and said first supply voltage terminal.

7. A parallel clocked latch circuit having first and second outputs, comprising:

gate means responsive to a plurality of input signals for providing logic levels at first and second outputs, said first and second outputs of said gate means being respectively coupled to the first and second outputs of the latch circuit;

level shifting means for providing a predetermined level shift of said logic levels of said gate means;

a first field-effect transistor having a drain coupled to the first output of the latch circuit, a gate coupled to the second output of the latch circuit, and a source;

a second field-effect transistor having a drain coupled to the second output of the latch circuit, a gate coupled to the first output of the latch circuit, and a source coupled to said source of said first field-effect transistor;

a third field-effect transistor having a drain coupled to said sources of said first and second field-effect transistors, a gate coupled to receive a control signal, and a source coupled to said gate means, said control signal having a first logic state level that exceeds a first logic state of said plurality of input signals of said gate means by a predetermined magnitude such that said control signal being in a first logic state renders said first and second field-effect transistors operative and said gate means non-operative; and a current source coupled between said source of said third field-effect transistor and a first supply voltage terminal.

8. The parallel clocked latch circuit according to claim 7 wherein said gate means includes:

a first field-effect transistor having a drain coupled to said level shifting means and to said second output of said gate means, a gate coupled to a first one of the plurality of inputs, and a source;

a second field-effect transistor having a drain coupled to said level shifting means and to said first output of said gate means, a gate coupled to a second one of the plurality of inputs, and a source coupled to said source of said first field-effect transistor of said gate means;

a third field-effect transistor having a drain coupled to said sources of said first and second field-effect transistors of said gate means, a gate coupled to a third one of the plurality of inputs, and a source;

a fourth field-effect transistor having a drain coupled to said drain of said second field-effect transistor of said gate means, a gate coupled to a fourth one of the plurality of inputs, and a source coupled to said source of said third field-effect transistor of said gate means and to said source of said third field-effect transistor of the latch circuit;

a first resistor coupled between said drain of said first field-effect transistor of said gate means and said level shifting means; and a second resistor coupled between said drain of said second field-effect transistor of said gate means and said level shifting means.

9. The parallel clocked latch circuit according to claim 8 wherein said level shifting means includes:

a resistor coupled between a second supply voltage terminal and said gate means.

* * * * *

UNITED STATES PATENT AND TRADEMARK OFFICE
CERTIFICATE OF CORRECTION

PATENT NO. : 5,041,740

DATED : August 20, 1991

INVENTOR(S) : Robert T. Smith

It is certified that error appears in the above-identified patent and that said Letters Patent is hereby corrected as shown below:

Column 5, line 45, claim 1 delete --redered-- and insert therefor "rendered".

Column 6, lines 58 and 59, claim 6, delete --and control electrodes, said first electrode being coupled to the second--.

Column 8, line 13, claim 7, insert --level-- after word "state".

Signed and Sealed this

Nineteenth Day of January, 1993

Attest:

DOUGLAS B. COMER

Attesting Officer

Acting Commissioner of Patents and Trademarks